(12) United States Patent
Murakami

(10) Patent No.: US 9,918,380 B2
(45) Date of Patent: Mar. 13, 2018

(54) NOISE REDUCTION BOARD AND ELECTRONIC DEVICE

(71) Applicant: FUJITSU LIMITED, Kawasaki-shi, Kanagawa (JP)

(72) Inventor: Hajime Murakami, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/208,944

(22) Filed: Jul. 13, 2016

(65) Prior Publication Data

US 2017/0048963 A1    Feb. 16, 2017

(30) Foreign Application Priority Data

Aug. 13, 2015  (JP) ................................. 2015-159759

(51) Int. Cl.
| | | |
|---|---|---|
| *H05K 1/02* | (2006.01) | |
| *H05K 1/14* | (2006.01) | |
| *H01L 23/31* | (2006.01) | |
| *H05K 1/11* | (2006.01) | |
| *G06F 1/18* | (2006.01) | |

(52) U.S. Cl.
CPC ........... *H05K 1/023* (2013.01); *H05K 1/0216* (2013.01); *H05K 1/0262* (2013.01); *H05K 1/115* (2013.01); *H05K 1/144* (2013.01); *G06F 1/183* (2013.01); *G06F 1/184* (2013.01); *H01L 2924/15174* (2013.01); *H01L 2924/15311* (2013.01); *H05K 1/113* (2013.01); *H05K 2201/042* (2013.01); *H05K 2201/1031* (2013.01); *H05K 2201/10371* (2013.01); *H05K 2201/10378* (2013.01); *H05K 2201/10734* (2013.01); *Y02P 70/611* (2015.11)

(58) Field of Classification Search
CPC ....... G06F 1/184; G06F 1/183; H05K 5/0021; H05K 2201/042; H05K 2201/10378
See application file for complete search history.

(56) References Cited

U.S. PATENT DOCUMENTS 5,986,506 A    11/1999  Oga
7,580,269 B2 *  8/2009  Li ........................ H05K 1/0212
                                                    361/306.3
(Continued)

FOREIGN PATENT DOCUMENTS

JP    10-308591    11/1998
JP    2000-058994   2/2000
(Continued)

*Primary Examiner* — James Wu
*Assistant Examiner* — Michael Matey
(74) *Attorney, Agent, or Firm* — Fujitsu Patent Center

(57) ABSTRACT

A noise reduction board includes: a first board; a second board arranged under the first board; a plurality of power feeding parts made of a metal in a shape of a pole and configured to electrically interconnect the first board and the second board; and a noise reduction part arranged between the power feeding parts, wherein the noise reduction part includes: a metal plate; an insulator configured to cover a surface of the metal plate; a first terminal provided on the side of the first board of the metal plate and electrically coupled to a ground pattern of the first board; and a second terminal provided on the side of the second board of the metal plate and electrically coupled to a ground pattern of the second board.

16 Claims, 9 Drawing Sheets

(56) References Cited

U.S. PATENT DOCUMENTS

| | | | |
|---|---|---|---|
| 8,227,704 B2* | 7/2012 | Park | H05K 1/0236 174/256 |
| 8,952,265 B2* | 2/2015 | Kim | H01L 23/64 174/262 |
| 9,307,642 B2* | 4/2016 | Tokuda | H05K 1/115 |
| 2004/0188815 A1* | 9/2004 | Aizawa | H01L 23/50 257/678 |
| 2005/0207131 A1* | 9/2005 | Prokofiev | H01L 23/50 361/760 |
| 2007/0076388 A1* | 4/2007 | Miyazaki | H05K 1/0231 361/760 |
| 2012/0105096 A1* | 5/2012 | Kuah | G01R 31/2812 324/763.01 |
| 2014/0133105 A1* | 5/2014 | Yee | H05K 7/20509 361/720 |

FOREIGN PATENT DOCUMENTS

| | | |
|---|---|---|
| JP | 2000-307211 | 11/2000 |
| JP | 2001-127387 | 5/2001 |

* cited by examiner

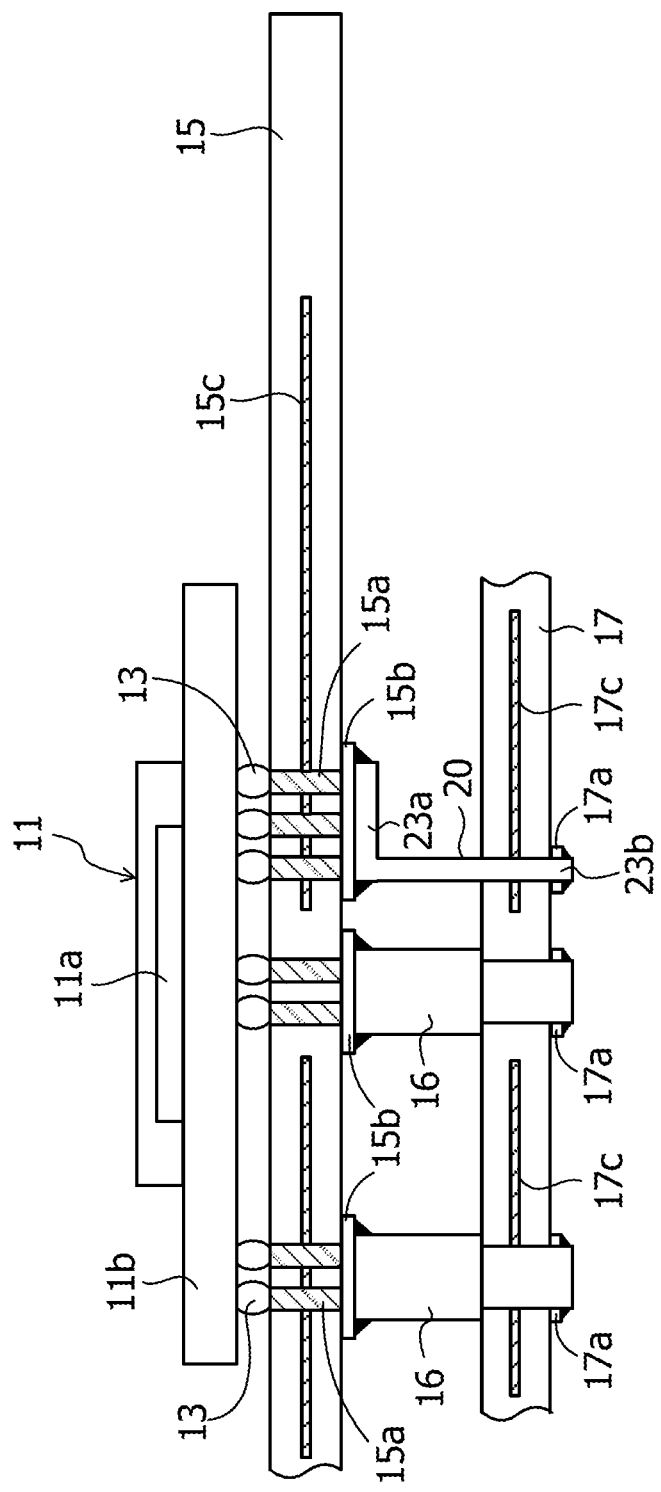

NOISE REDUCTION BOARD AND ELECTRONIC DEVICE

CROSS-REFERENCE TO RELATED APPLICATION

This application is based upon and claims the benefit of priority of the prior Japanese Patent Application No. 2015-159759, filed on Aug. 13, 2015, the entire contents of which are incorporated herein by reference.

FIELD

The embodiments discussed herein are related to a noise reduction board and an electronic device.

BACKGROUND

Semiconductor devices such as, for example, a Central Processing Unit (CPU) for use in, for example, a server are improved in performance and density. Further, the wiring of a print circuit board on which such a semiconductor device is mounted is also formed more finely and densely.

Related techniques are disclosed in, for example, Japanese Patent Laid-Open Publication No. 2000-307211, Japanese Patent Laid-Open Publication No. 10-308591, Japanese Patent Laid-Open Publication No. 2001-127387, or Japanese Patent Laid-Open Publication No. 2000-058994.

SUMMARY

According to one aspect of the embodiments, a noise reduction board includes: a first board; a second board arranged under the first board; a plurality of power feeding parts made of a metal in a shape of a pole and configured to electrically interconnect the first board and the second board; and a noise reduction part arranged between the power feeding parts, wherein the noise reduction part includes: a metal plate; an insulator configured to cover a surface of the metal plate; a first terminal provided on the side of the first board of the metal plate and electrically coupled to a ground pattern of the first board; and a second terminal provided on the side of the second board of the metal plate and electrically coupled to a ground pattern of the second board.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

BRIEF DESCRIPTION OF DRAWINGS

FIG. 4 illustrates an exemplary connection of a power feeding part, a noise reduction part, a main board, and a power supply board;

DESCRIPTION OF EMBODIMENTS

With the improvement of performance of a semiconductor device, the power consumption of the semiconductor device tends to increase. Therefore, for example, in a method of supplying power to the semiconductor device through fine wiring of a print circuit board, a voltage drop in the fine wiring may cause a problem. Further, as the wiring of the print circuit board is formed more finely and densely, an interval between wires is reduced so that the effect of noise caused by a current flowing in adjacent wires may not be negligible.

For example, there may be a method of reducing noise that is superimposed on a power line or a signal line coupled to the print circuit board.

Figure 1A:
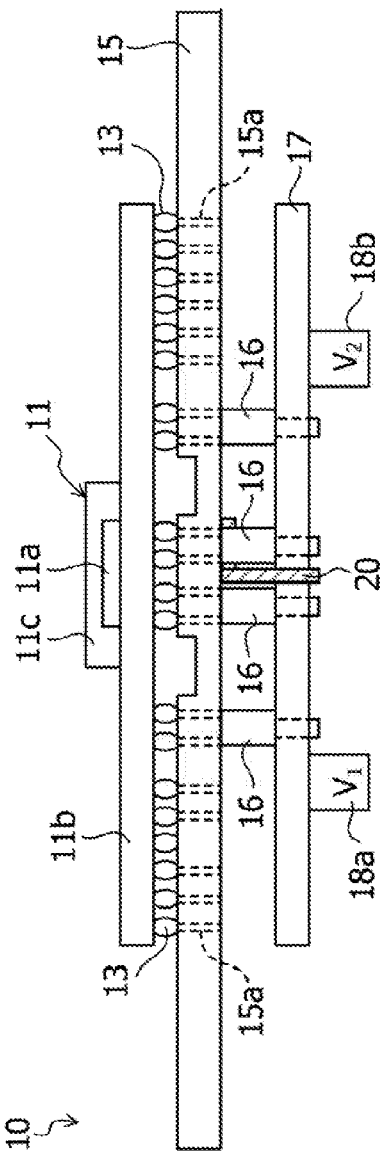
FIG. 1A illustrates an exemplary sectional view of a noise reduction board.
Figure 1B:
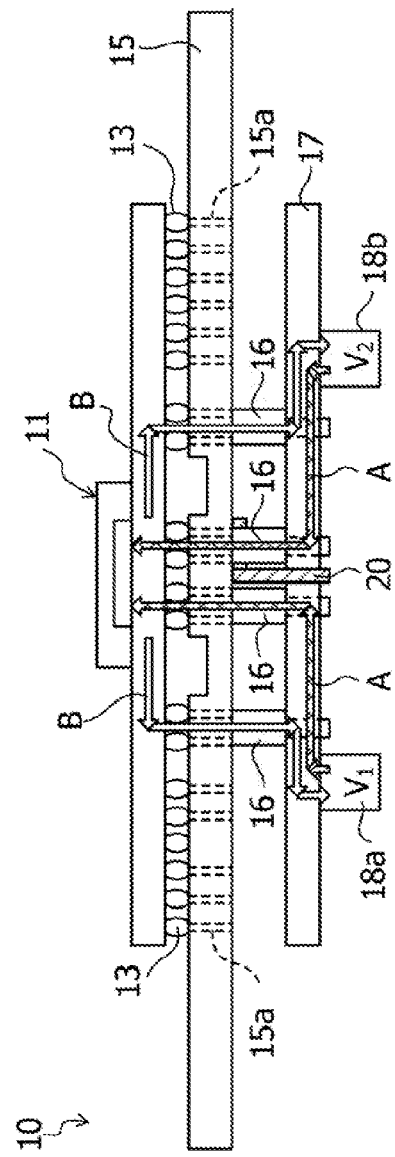
FIG. 1B illustrates an exemplary current path of the noise reduction board.

FIG. 1A illustrates an exemplary sectional view of a noise reduction board. FIG. 1B illustrates an exemplary current path of the noise reduction board. In FIG. 1B, arrow A indicate an outward side current path, and arrow B indicates a return side current path.

As illustrated in FIG. 1A, the noise reduction board 10 includes a semiconductor device 11, a main board 15, and a power supply board 17 on which a plurality of (two in FIG. 1) power supply sources 18a and 18b is mounted. The semiconductor device 11 includes a package board 11b, a semiconductor chip 11a mounted on the package board 11b, and a sealant 11c that seals the semiconductor chip 11a.

The main board 15 may be an example of a first board, and the power supply board 17 may be an example of a second board. Both the main board 15 and the power supply board 17 may be print circuit boards that include pattern wiring formed by patterning copper foils.

The semiconductor device 11 (package board 11b) and the main board 15 are coupled to each other via BGAs (Ball Grid Arrays) 13. The power supply board 17 is arranged under the main board 15 (at the opposite side to the semiconductor device 11), and is electrically coupled with the main board 15 via power feeding parts 16 that are made of a metal such as, for example, copper, in the shape of a pole.

As illustrated in FIG. 1B, voltages $V_1$ and $V_2$ that are output from the power supply sources 18a and 18b, respectively, are supplied from the power feeding parts 16 located just below the semiconductor chip 11a to the main board 15. The voltages $V_1$ and $V_2$ are supplied to the package board 11b through the through holes 15a of the main board 15 and the BGAs 13, and are also supplied to the semiconductor chip 11a from the package board 11b.

The power feeding parts 16, the through holes 15a, and the BGAs 13, which constitute the outward side current path, are arranged on a substantially straight line such that the outward side (positive side) current path from the power supply board 17 to the semiconductor chip 11a may be made the shortest. Power is supplied to the semiconductor chip 11a through the power feeding parts 16, the through holes 15a, and the BGAs 13.

Meanwhile, the return side (negative side) current path reaches the power supply board 17 through the pattern wiring of the package board 11b, and through the BGAs 13, the through holes 15a of the main board 15, and the power feeding parts 16.

Since the power is supplied to the semiconductor chip 11a without passing through the fine wiring (pattern wiring) of the main board 15 and the package board 11b, a voltage drop in the current path may be decreased.

The power feeding part 16, through which the current supplied from the power supply source 18a passes, and the power feeding part 16, through which the current supplied from the power supply source 18b passes, are arranged to be adjacent to each other. In this case, noise generated by the current flowing in one power feeding part 16 is superimposed on the current flowing in the other power feeding part 16, which may cause the semiconductor chip 11a to malfunction.

A noise reduction part 20 is arranged, for example, between the power feeding part 16 coupled to the power supply source 18a and the power feeding part 16 coupled to the power supply source 18b.

Figure 2A:
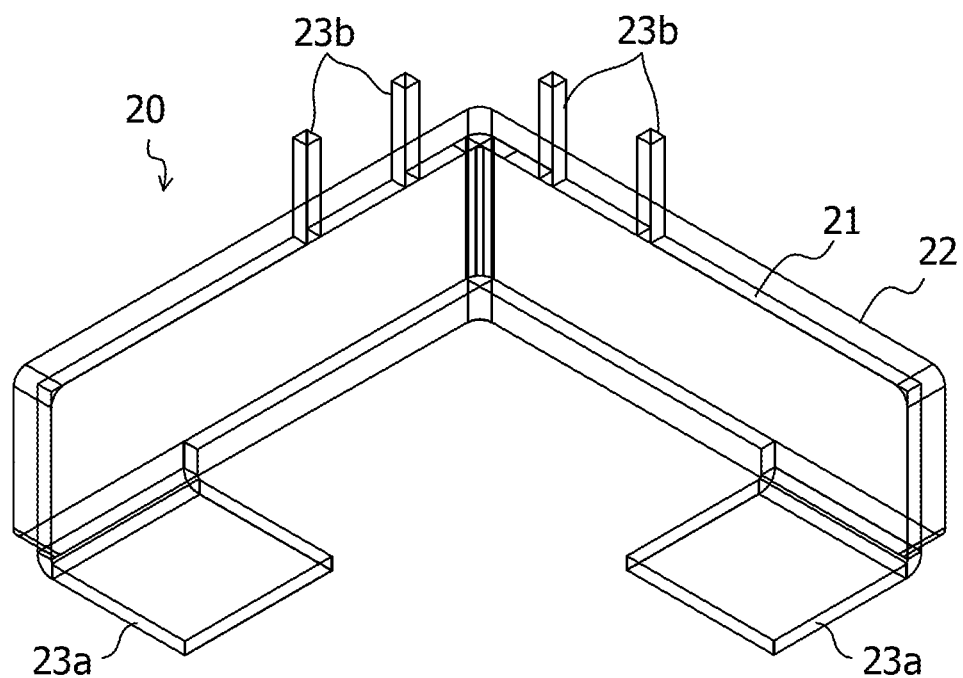
FIG. 2A illustrates an exemplary perspective view of a noise reduction part.
Figure 2B:
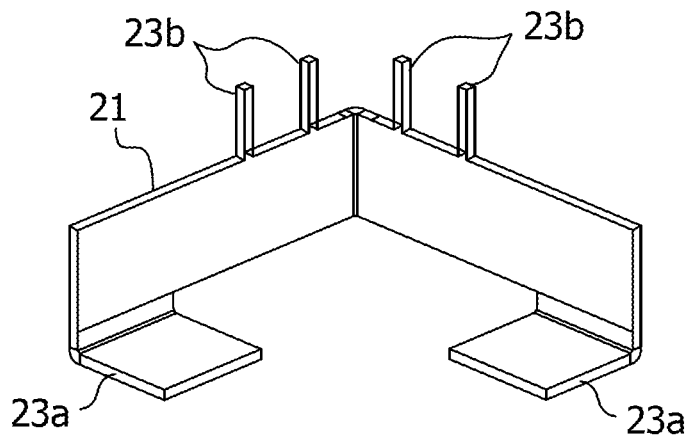
FIG. 2B illustrates an exemplary perspective view of a metal plate of the noise reduction part.

FIG. 2A illustrates an exemplary perspective view of a noise reduction part. FIG. 2B illustrates an exemplary perspective view of a metal plate of the noise reduction part.

As shown in FIG. 2A, the noise reduction part 20 has the metal plate 21 made of a metal such as, for example, copper, and insulators 22 covering the both surfaces of the metal plate 21. In the noise reduction part 20 illustrated in FIGS. 2A and 2B, the metal plate 21 is bent in an L shape. The thickness of the metal plate 21 is, for example, 0.5 mm, and the thickness of the insulators 22 covering the metal plate 21 is, for example, 0.5 mm.

The metal plate 21 is provided, at one side in the height direction thereof, with flat-plate-shaped terminals 23a to be coupled to the main board 15, and provided, at the the other side, with pin-shaped terminals 23b to be coupled to the power supply board 17.

Figure 3:
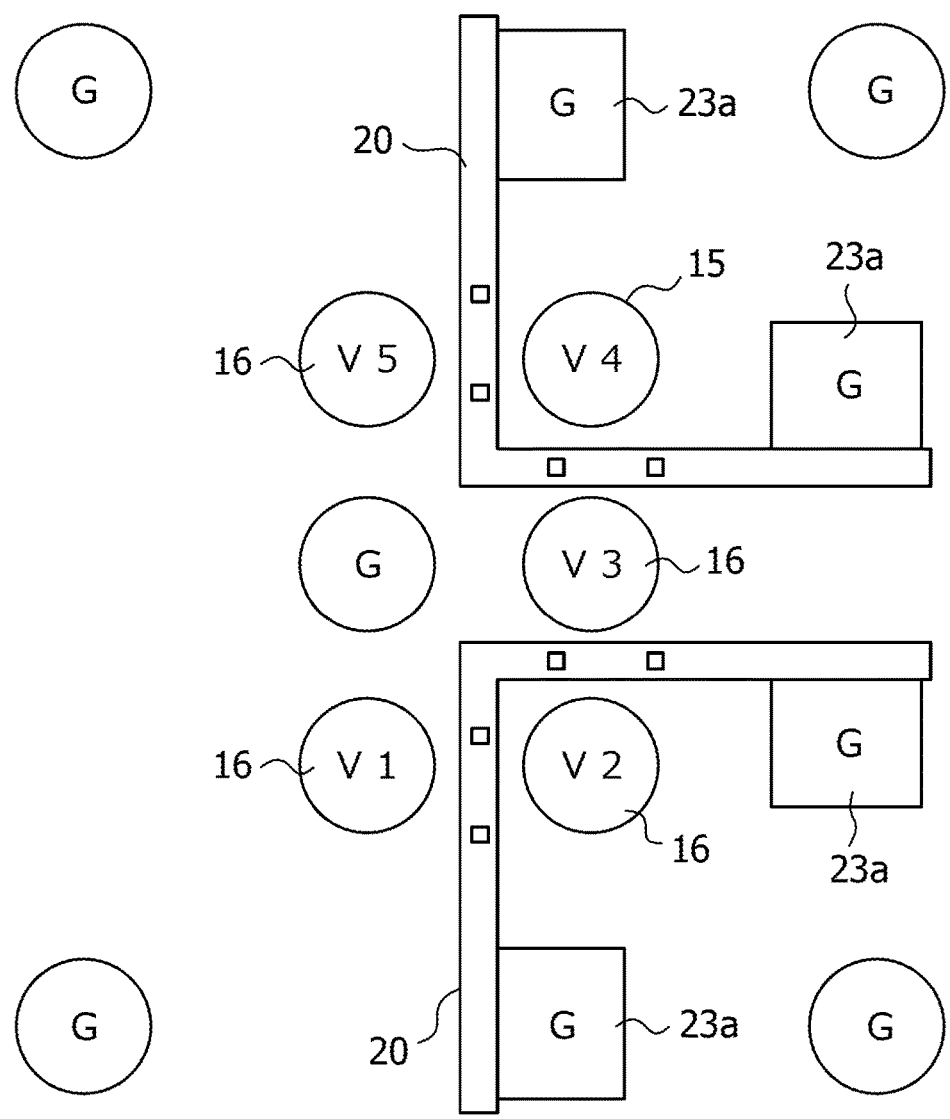
FIG. 3 illustrates an exemplary plan view of the noise reduction part.

FIG. 3 illustrates an exemplary plan view of the noise reduction part.

In FIG. 3, two noise reduction parts 20 are used. One noise reduction part 20 is arranged between three power feeding parts 16 which are supplied with different voltages $V_1$, $V_2$, and $V_3$, respectively. The other noise reduction part 20 is arranged between three power feeding parts 16 which are supplied with different voltages $V_3$, $V_4$ and $V_5$, respectively.

All the terminals 23a of the noise reduction parts 20 are coupled to a ground (G) pattern of the main board 15.

Since the distance (clearance) between the power feeding parts 16 is, for example, 2 mm and the thickness of the noise reduction parts 20 is 1.5 mm, each of the noise reduction parts 20 may be sufficiently arranged between the power feeding parts 16. Since the surfaces of the noise reduction part 20 are covered with the insulators 22, a problem such as, for example, a short circuit may not occur even if the power feeding part 16 comes into contact with the noise reduction part 20.

FIG. 4 illustrates an exemplary connection of power feeding parts, a noise reduction part, a main board, and a power supply board.

As illustrated in FIG. 4, planar terminals 15b are provided on a surface of the main board 15. The tip end face of one side of a power feeding part 16 and a terminal 23a of a noise reduction part 20 are coupled to the planar terminals 15b of the main board 15, respectively, using a surface mount technology (SMT). The terminal 15b coupled to the terminal 23a of the noise reduction part 20 is electrically coupled to a ground pattern 15c of the main board 15, through, for example, a through hole 15a.

The power supply board 17 is provide with through holes and terminals (land patterns) 17a. The other end of the power feeding part 16 and the terminal 23b of the noise reduction part 20 are inserted into the through holes and then coupled to the terminals 17a, respectively, by soldering. The terminal 17a coupled with the terminal 23a of the noise reduction part 20 is electrically coupled to an electrode (common electrode) on a ground side of each power supply source through a ground pattern 17c of the power supply board 17.

For example, the ground pattern 15c of the main board 15 and the ground pattern 17c of the power supply board 17 are electrically coupled to each other via the noise reduction part 20, and are also coupled to a common electrode of respective power supply sources.

The terminal 23a of the noise reduction part 20 may be formed in the shape of a pin like the terminal 23b. In that case, since the through holes are formed in the main board 15, it may be difficult to connect the semiconductor device 11 to the main board 15 via BGAs. For example, the terminal 23a of the noise reduction part 20 on the side of the main board 15 may be a flat-plate-shaped terminal that may not require a through hole.

After the power feeding parts 16 and the noise reduction part 20 are coupled to the main board 15 by the SMT (Surface Mount Technology), it may be difficult to couple the power feeding parts 16 and the noise reduction part 20 to the power supply board 17 by the SMT. Therefore, a through hole is formed in the power supply board 17, and then the end of the power feeding part 16 and the terminal 23b of the noise reduction part 20 are inserted into the through hole to be soldered at the side opposite to the main board 15.

FIGS. 5A to 5D illustrate an exemplary plan views of a noise reduction part.

Figure 5A:
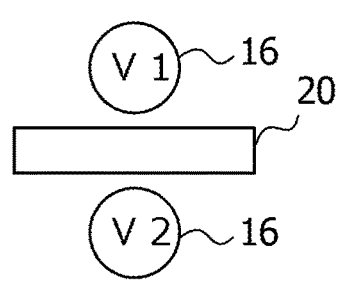
FIGS. 5A to 5D illustrate exemplary plan views of the noise reduction part, respectively.
Figure 5B:
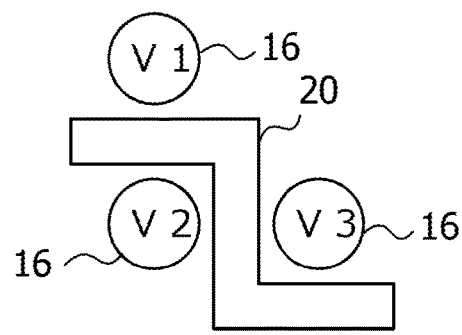

In FIG. 5A, a flat-plate-shaped noise reduction part 20 is arranged between two power feeding parts 16 which are supplied with voltages $V_1$ and $V_2$, respectively, so that noise between the respective power feeding parts 16 is cut off or reduced. In FIG. 5B, a noise reduction part 20 bent in a crank shape is arranged between three power feeding parts 16 which are supplied with voltages $V_1$, $V_2$, and $V_3$, respectively, so that noise between the respective power feeding parts 16 is cut off or reduced.

Figure 5C:
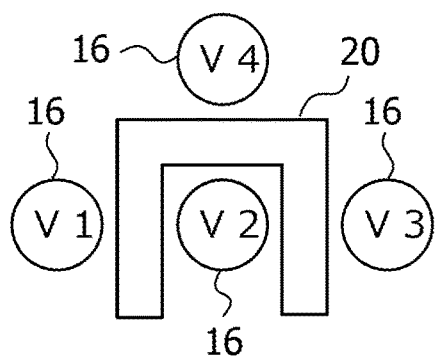
Figure 5D:
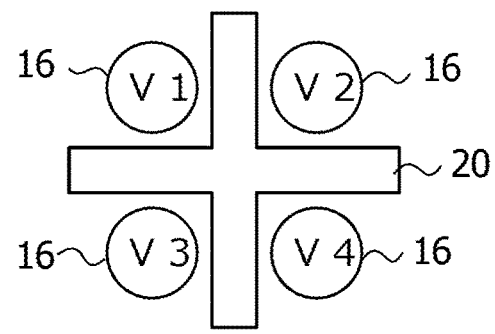

In FIG. 5C, a n-shaped noise reduction part 20 is arranged to surround a power feeding part 16 which is supplied with a voltage $V_2$, among four power feeding parts 16 which are supplied with voltages $V_1$, $V_2$, $V_3$, and $V_4$, respectively, so that noise between the respective power feeding parts 16 is cut off or reduced. In FIG. 5D, a cross-shaped noise reduction part 20 is arranged between four power feeding parts 16 which are supplied with voltages $V_1$, $V_2$, $V_3$, and $V_4$, respectively, so that noise between the power feeding parts 16 is cut off or reduced.

Figure 6:
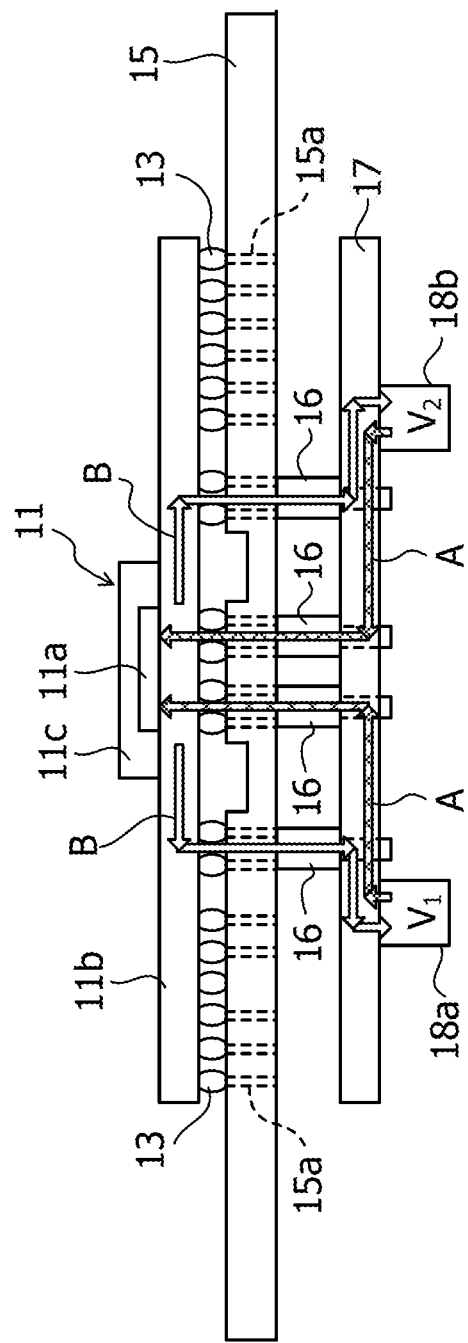
FIG. 6 illustrates an exemplary method of feeding power to a semiconductor device.

FIG. 6 illustrates an exemplary method of feeding power to a semiconductor device.

In FIG. 6, power is supplied from a power supply board 17 to a semiconductor chip 11a through a main board 15 using power feeding parts 16. As in FIG. 1B, in FIG. 6, the power feeding parts 16, through holes 15a and BGAs 13 constituting an outward side current path which is indicated by arrow A are arranged on a substantially straight line.

Unlike FIG. 1B, in FIG. 6, the noise reduction part 20 may not be arranged between the power feeding parts 16.

In FIG. 6, power noise superimposed from one power feeding part 16 to another power feeding part 16 and a voltage drop in the outward side current path were analyzed by simulation. As a result, the power noise was about 40 mV, and the voltage drop was about 22 mV.

Figure 7:
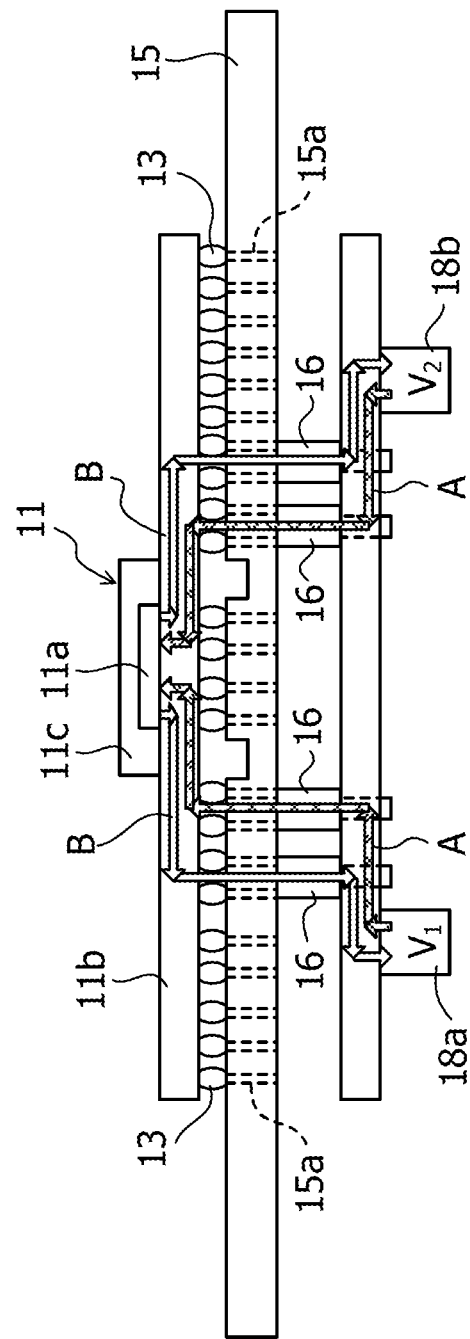
FIG. 7 illustrates an exemplary method of feeding power to a semiconductor device.

FIG. 7 illustrates an exemplary method of feeding power to a semiconductor device.

In FIG. 7, a power feeding part 16 which is supplied with the voltage $V_1$ and the power feeding part 16 which is supplied with the voltage $V_2$ are arranged to be spaced apart from each other, and power is supplied to the semiconductor chip 11a through pattern wiring (fine wiring) provided in the package board 11b.

In FIG. 7, power noise superimposed from one power feeding part 16 to another power feeding part 16 and a voltage drop in the current path of the outward side were analyzed by simulation. As a result, the power noise was about 5 mV which is lower than that in FIG. 6, but the voltage drop was about 71 mV that is about 3.5 times that of FIG. 6.

Figure 8:
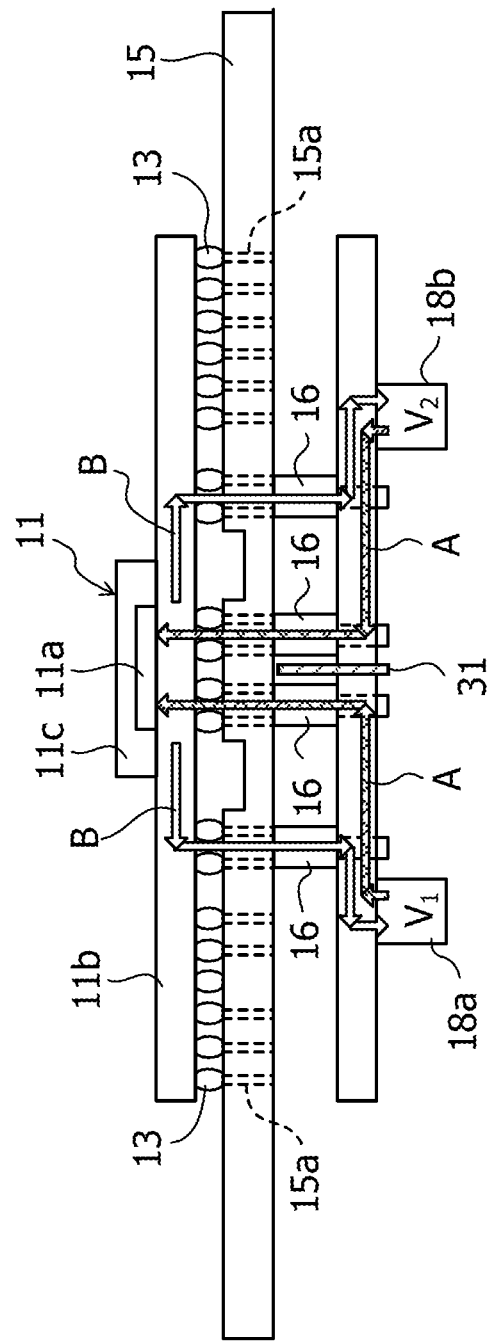
FIG. 8 illustrates an exemplary method of feeding power to a semiconductor device.

FIG. 8 illustrates an exemplary method of feeding power to a semiconductor device.

As in FIG. 1B, in FIG. 8, power feeding parts 16, through holes 15a, and a semiconductor device 11 (semiconductor chip 11a) constituting an outward side current path are arranged roughly in a substantially straight line. In FIG. 8, a shield plate 31 is placed between the power feeding parts 16.

The shield plate 31 has a structure in which a surface of a metal plate is coated with a resin. This shield plate 31 is coupled to a ground pattern of the power supply board 17, but is not connected to a ground pattern of the main board 15.

In FIG. 8, power noise superimposed from one power feeding part 16 to another power feeding part 16 and a voltage drop in the current path of the outward side were analyzed by simulation. As a result, the voltage drop in the current path was very similar to that of FIG. 6, but the power noise became about 94 mV that is twice that of FIG. 6.

In the method of feeding power to the semiconductor device illustrated in FIG. 1B, power noise superimposed from one power feeding part 16 to another power feeding part 16 and a voltage drop in the current path of the outward side were analyzed by simulation. As a result, the voltage drop in the current path was very similar to that of FIG. 6, but the power noise became about 2 mV, so that the power noise was reduced up to 1/20 of comparative example 1.

Based on the simulation results, the noise reduction board 10 and the noise reduction part 20 of FIGS. 1A and 1B may be useful.

Figure 9:
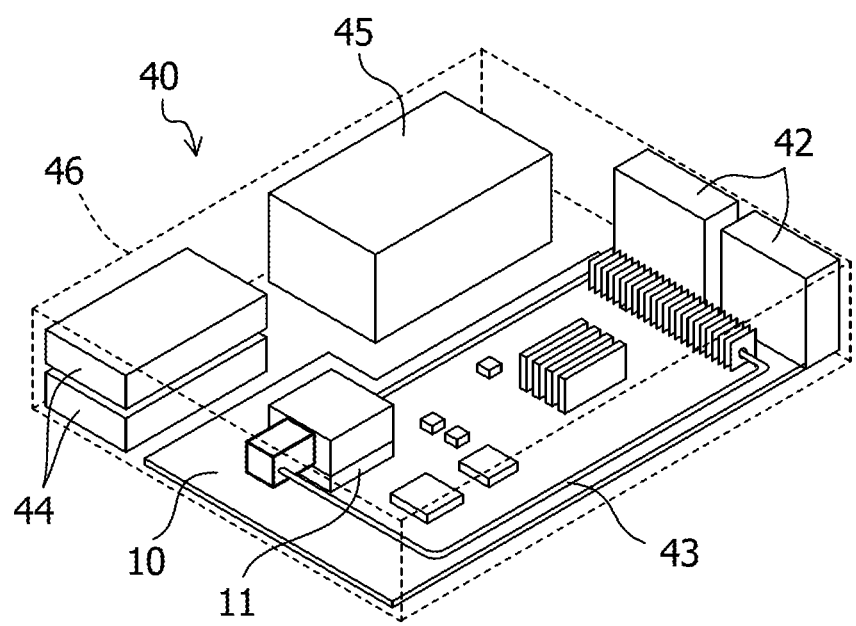
FIG. 9 illustrates an exemplary perspective view of an electronic device having a noise reduction board.

FIG. 9 illustrates an exemplary perspective view of an electronic device that includes a noise reduction board. The electronic device of FIG. 9 may have the noise reduction board 10 illustrated in FIGS. 1A and 1B. The electronic device may be a computer, or may be an electronic device other than the computer.

A computer 40 includes a noise reduction board 10 on which a semiconductor device (CPU) 11 is mounted, a fan (blower) 42, a heat pipe 43, a hard disc drive (memory unit) 44, and a power unit 45. The noise reduction board 10, the fan 42, the heat pipe 43, the hard disc drive 44, and the power unit 45 are accommodated in a housing 46.

Since the power noise reduction board 10 configured as described above is mounted on the electronic device (computer 40) illustrated in FIG. 9, the malfunction caused by power noise may be avoided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A noise reduction board comprising:
a first board;
a second board arranged under the first board;
a plurality of power feeding parts made of a metal in a shape of a pole and configured to electrically interconnect the first board and the second board; and
a noise reduction part arranged between the power feeding parts when viewed from above, the noise reduction part includes:
a metal plate;
an insulator configured to cover both surfaces of the metal plate;
a first terminal provided on the side of the first board of the metal plate and electrically coupled to a ground pattern of the first board; and
a second terminal provided on the side of the second board of the metal plate and electrically coupled to a ground pattern of the second board.

2. The noise reduction board according to claim 1, wherein a semiconductor device is mounted on the first board, and a plurality of power supply sources are mounted on the second board.

3. The noise reduction board according to claim 2, wherein the noise reduction part is arranged between one of the power feeding parts electrically coupled with one of the plurality of power supply sources and another one of the power feeding part electrically coupled with another one of the plurality of power supply sources.

4. The noise reduction board according to claim 2, wherein a through hole is formed through the first board from one surface of the first board to another surface of the first board so as to electrically connect at least one of the power feeding parts with a semiconductor device.

5. The noise reduction board according to claim 4, wherein a current output from at least one of the plurality of power supply sources is supplied to the semiconductor device from the second board through the through hole, without passing through pattern wiring of the first board.

6. The noise reduction board according to claim 1, wherein the first terminal has a shape of a flat plate, and the second terminal has a shape of a pin, the first terminal is coupled to a planar terminal on a surface of the first board, and the second terminal is inserted into a through hole of the second board.

7. The noise reduction board according to claim 1, wherein the noise reduction part has any one of an L shape, a straight-line shape, a crank shape, a n shape, and a cross shape, when viewed from above.

8. An electronic device comprising:
a housing; and a noise reduction board accommodated in the housing, the noise reduction board includes:
a first board;
a second board arranged under the first board;
a plurality of power feeding parts made of a metal in a shape of a pole and configured to electrically interconnect the first board with the second board; and
a noise reduction part arranged between the power feeding parts when viewed from above, the noise reduction part includes:
a metal plate;
an insulator covering both surfaces of the metal plate;
a first terminal provided on the metal plate around the first board and electrically coupled to a ground pattern of the first board; and
a second terminal provided on the metal plate around the second board and electrically coupled to a ground pattern of the second board.

9. The electronic device according to claim 8, wherein a semiconductor device is mounted on the first board, and a plurality of power supply sources are mounted on the second board.

10. The electronic device according to claim 9, wherein the noise reduction part is arranged between one of the power feeding parts electrically coupled with one of the plurality of power supply sources and another one of the power feeding part electrically coupled with another one of the plurality of power supply sources.

11. The electronic device according to claim 9, wherein a through hole is formed through the first board from one surface of the first board to another surface of the first board so as to electrically connect at least one of the power feeding parts with a semiconductor device.

12. The electronic device according to claim 11, wherein a current output from at least one of the plurality of power supply sources is supplied to the semiconductor device from the second board through the through hole, without passing through pattern wiring of the first board.

13. The electronic device according to claim 8, wherein the first terminal has a shape of a flat plate, and the second terminal has a shape of a pin, the first terminal is coupled to a planar terminal on a surface of the first board, and the second terminal is inserted into a through hole of the second board.

14. The electronic device according to claim 8, wherein the noise reduction part has any one of an L shape, a straight-line shape, a crank shape, a n shape, and a cross shape, when viewed from above.

15. The noise reduction board according to claim 4, wherein the power feeding parts, the through hole, and the semiconductor device are arranged roughly in a substantially straight line.

16. The electronic device according to claim 11, wherein the power feeding parts, the through hole, and the semiconductor device are arranged roughly in a substantially straight line.

* * * * *